(12) United States Patent
Bender et al.

(10) Patent No.: US 10,907,963 B2
(45) Date of Patent: *Feb. 2, 2021

(54) USING PHOTOGRAMMETRY TO AID IDENTIFICATION AND ASSEMBLY OF PRODUCT PARTS

(71) Applicant: Wayfair LLC, Boston, MA (US)

(72) Inventors: Michael Bender, Rye Brook, NY (US);
Rhonda L. Childress, Austin, TX (US);
David B. Kumhyr, Austin, TX (US);
Michael J. Spisak, East Northport, NY (US)

(73) Assignee: Wayfair LLC, Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/787,724

(22) Filed: Feb. 11, 2020

(65) Prior Publication Data

US 2020/0249018 A1  Aug. 6, 2020

Related U.S. Application Data

(63) Continuation of application No. 16/151,371, filed on Oct. 4, 2018, now Pat. No. 10,571,266, which is a (Continued)

(51) Int. Cl.
*G01C 11/06* (2006.01)
*G06Q 30/00* (2012.01)
(Continued)

(52) U.S. Cl.
CPC .............. *G01C 11/06* (2013.01); *G06F 30/00* (2020.01); *G06K 9/00214* (2013.01);
(Continued)

(58) Field of Classification Search
CPC combination set(s) only.
See application file for complete search history.

(56) References Cited

U.S. PATENT DOCUMENTS

| 5,910,894 A | 6/1999 | Pryor |
| 6,036,087 A | 3/2000 | Hong et al. |

(Continued)

FOREIGN PATENT DOCUMENTS

| EP | 2368799 A1 | 9/2011 |
| KR | 10-2015-0063703 A | 6/2015 |

OTHER PUBLICATIONS

Blizard, B., "The Art of Photogrammetry: How to Take Your Photos," Feb. 19, 2014, 19 pages, http://www.tested.com/art/makers/460142-art-photogrammetry-how-take-your-photos/.

(Continued)

*Primary Examiner* — Janese Duley
(74) *Attorney, Agent, or Firm* — Wolf, Greenfield & Sacks, P.C.

(57) ABSTRACT

A user may be aided in modifying a product that is an assemblage of parts. This aid may involve a processor obtaining images of a target part captured by the user on a mobile device camera. The processor may compare, based on the captured images and a plurality of images of identified parts, the target part to the identified parts. Based on the comparison, the processor may determine an identity of the target part. This aid may also involve a processor obtaining images of a first configuration of a partial assembly of the product captured by a mobile device camera. The processor may compare, based on the captured images, the first configuration to a correct configuration of the partial assembly. Based on the comparison, the processor may determine that the first configuration does not match the correct configuration and may notify the user accordingly.

15 Claims, 7 Drawing Sheets

Related U.S. Application Data continuation of application No. 14/873,260, filed on Oct. 2, 2015, now Pat. No. 10,168,152.

(51) Int. Cl.
  *G06K 9/00* (2006.01)
  *G06F 30/00* (2020.01)
  *G06T 17/00* (2006.01)

(52) U.S. Cl.
  CPC ........... *G06Q 30/016* (2013.01); *G06T 17/00* (2013.01); *G06K 2209/40* (2013.01)

(56) References Cited

U.S. PATENT DOCUMENTS

| | | | |
|---|---|---|---|
| 6,912,293 | B1 | 6/2005 | Korobkin |
| 6,989,831 | B2 | 1/2006 | Ebersole et al. |
| 7,174,233 | B1 | 2/2007 | Blackshear et al. |
| 7,277,752 | B2 | 10/2007 | Matos |
| 7,831,292 | B2 | 11/2010 | Quaid et al. |
| 7,839,416 | B2 | 11/2010 | Ebensberger et al. |
| 7,839,417 | B2 | 11/2010 | Ebensberger et al. |
| 8,374,835 | B2 | 2/2013 | Lind et al. |
| 9,576,498 | B1 | 2/2017 | Zimmerman et al. |
| 10,168,152 | B2 | 1/2019 | Bender et al. |
| 10,571,266 | B2 | 2/2020 | Bender et al. |
| 2008/0278481 | A1 | 11/2008 | Aguera y Arcas et al. |
| 2012/0122062 | A1 | 5/2012 | Yang et al. |
| 2012/0128240 | A1 | 5/2012 | Rothschild |
| 2013/0093829 | A1 | 4/2013 | Rosenblatt et al. |
| 2013/0137076 | A1 | 5/2013 | Perez et al. |
| 2013/0171596 | A1 | 7/2013 | French |
| 2013/0278635 | A1* | 10/2013 | Maggiore ............. G06T 19/006 345/633 |
| 2014/0225888 | A1 | 8/2014 | Bell et al. |
| 2014/0267691 | A1 | 9/2014 | Humphrey et al. |
| 2015/0243013 | A1 | 8/2015 | White et al. |
| 2015/0363924 | A1 | 12/2015 | Steiger et al. |
| 2016/0005320 | A1 | 1/2016 | deCharms et al. |
| 2016/0140868 | A1 | 5/2016 | Lovett et al. |
| 2016/0314704 | A1 | 10/2016 | Bell |
| 2017/0011498 | A1 | 1/2017 | Yu et al. |
| 2017/0097236 | A1 | 4/2017 | Bender et al. |
| 2017/0206714 | A1 | 7/2017 | Arcas et al. |
| 2017/0352282 | A1 | 12/2017 | Anderson et al. |
| 2018/0300533 | A1 | 10/2018 | Maranzana et al. |
| 2019/0033072 | A1 | 1/2019 | Bender et al. |

OTHER PUBLICATIONS

IBM, List of IBM Patents or Patent Applications Treated as Related, Oct. 3, 2018, 2 pages.

Moore et al., "Identifying Sources of Solder Defects in Printed Circuit Assemblies Incorporating Ball Grid Array Packages", Proceedings of the Technical Program, San Jose, CA, Aug. 23-27, 1998, 6 pages.

Schlieper, F., "BGA Inspection and Rework Improve Yield", SMT, The Magazine for Electronics Assembly, Mar. 1999, vol. 13, No. 3, 4 pages.

Unknown, "Photogrammetry," Wikipedia, the free encyclopedia, last modified Aug. 13, 2015 at 3:43, 5 pages, https://en.wikipedia.org/wiki/Photogrammetry.

* cited by examiner

USING PHOTOGRAMMETRY TO AID IDENTIFICATION AND ASSEMBLY OF PRODUCT PARTS

CROSS REFERENCE TO RELATED APPLICATIONS

This application claims priority under 35 U.S.C. § 120 and is a continuation of U.S. application Ser. No. 16/151,371, filed Oct. 4, 2018, entitled "USING PHOTOGRAMMETRY TO AID IDENTIFICATION AND ASSEMBLY OF PRODUCT PARTS", which claims priority under 35 U.S.C. § 120 and is a continuation of U.S. application Ser. No. 14/873,260, filed Oct. 2, 2015, entitled "USING PHOTOGRAMMETRY TO AID IDENTIFICATION AND ASSEMBLY OF PRODUCT PARTS".

BACKGROUND

The present disclosure relates to data processing and, more specifically, to using photogrammetry to aid in the identification and assembly of product parts.

Photogrammetry is the science of taking measurements from images. Typically, the input of photogrammetric methods is a set (i.e., one or more) of images (e.g., still frames or video footage) of a real-world object of interest. The corresponding output of these methods is typically a computer-rendered measurement, image, or three-dimensional (3D) model of that real-world object. By analyzing this output, a user may be able to glean additional data about the real-world object and other real-world objects with which it is associated.

SUMMARY

According to embodiments of the present disclosure, aspects of the disclosure may include computer-implemented method for aiding a user in modifying a product. The product is an assemblage of a plurality of parts. As part of the method, a processor obtains a set of images of a target part of the product captured by the user on a mobile device camera. The processor compares, based on the set of images and a plurality of images of identified parts of the plurality of parts, the target part to the identified parts. Based on the comparison, the processor determines an identity of the target part.

According to embodiments of the present disclosure, aspects of the disclosure may also include a computer program product for aiding a user in assembling a product. The computer program product includes a computer readable storage medium having program instructions embodied therewith. The program instructions are executable by a processor to cause the processor to perform a method. As part of the method, the processor obtains a set of images captured by a mobile device camera. The captured image set includes a first configuration of a partial assembly of the product. The processor compares, based on the captured image set, the first configuration to a correct configuration of at least the partial assembly. Based on the comparison, the processor determines that the first configuration does not match the correct configuration. The processor notifies the user that the first configuration is incorrect.

According to embodiments of the present disclosure, aspects of the disclosure may also include a system for aiding a user in modifying a product. The product is an assemblage of a plurality of parts. The system includes a memory and a processor in communication with the memory. The processor is configured to perform a method. As part of the method, a set of images of a target part of the product captured by the user on a mobile device camera is obtained. A comparison of the target part to identified parts of the plurality of parts is made based on the set of images and a plurality of images of the identified parts. Based on the comparison, an identity of the target part is determined.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of some embodiments and do not limit the disclosure.

Figure 1A:
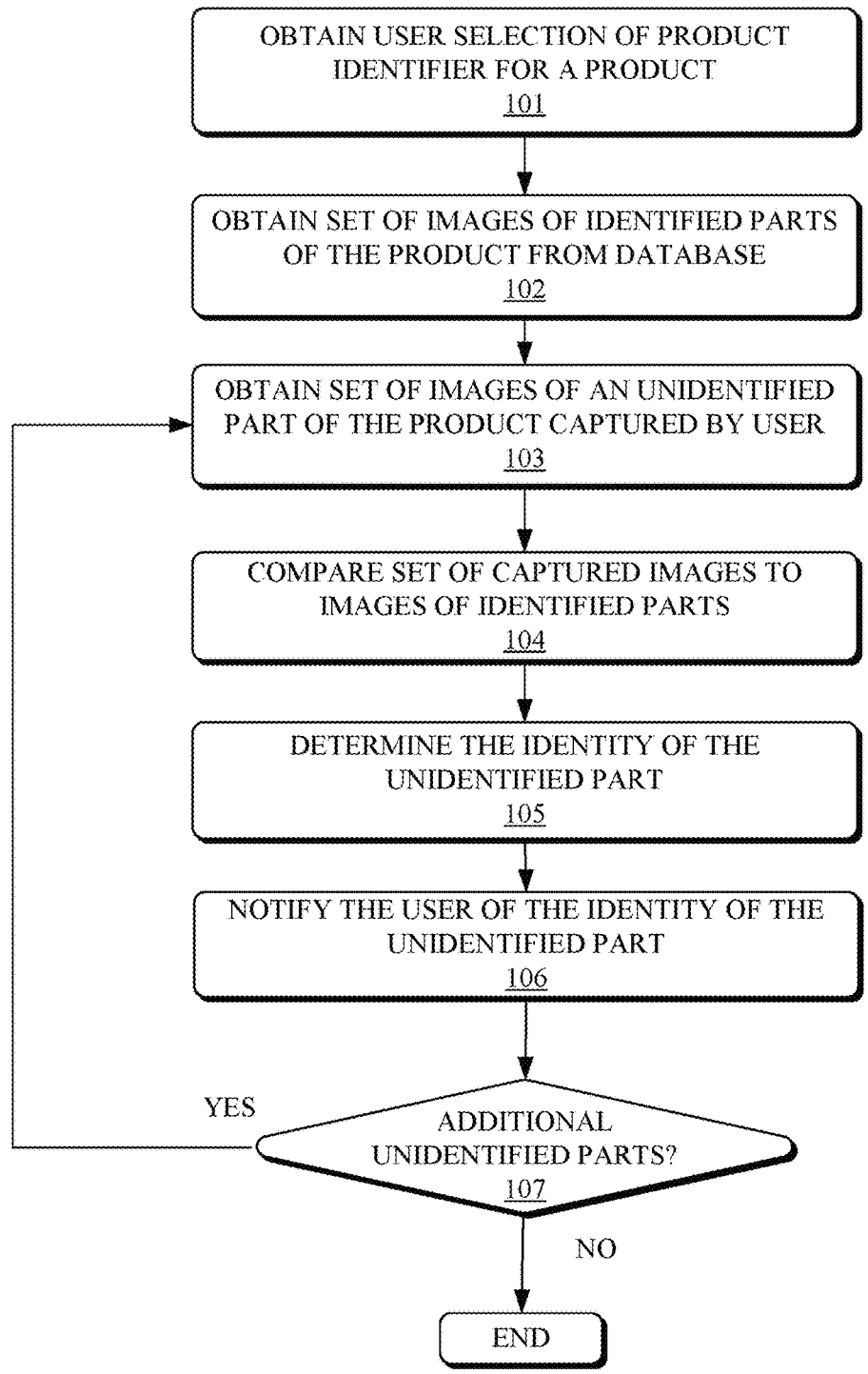
FIG. 1A illustrates a flowchart of an example method for aiding a user in identifying a product part, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to data processing and, more specifically, to using photogrammetry to aid in the identification and assembly of product parts. While the present disclosure is not necessarily limited to such applications, various aspects of the disclosure may be appreciated through a discussion of various examples using this context.

Consumers frequently purchase products that require assembly at home. In some situations, at-home assembly can be a tedious and difficult process. This may be especially true for a product that is made from a large number of parts that an end-user is expected to put together. Furthermore, in some situations, putting even just a few of these parts together improperly may greatly increase the product build time or even damage some parts of the product, rendering them unusable.

Consumers may also need to purchase replacement parts for previously assembled products (e.g., a new blade for a lawn mower). Often, the consumer may not know the name, part number, or other identifier for a broken part. This can impede the consumer's search for a suitable replacement part.

In some embodiments of the present disclosure, photogrammetric techniques may be used in the identification and assembly of product parts within a consumer environment and by the consumer. These techniques may aid a user in modifying (e.g., assembling, disassembling, repairing) a product. This may result in effective part identification and efficient product assembly. For example, a user may use a mobile device to capture a set of images of a set of parts of interest and then compare those captured images to stored images of identified product parts or correct configurations of those parts at various stages of product assembly. Further, in some embodiments, captured images may be combined to create models that aid these comparisons.

In some embodiments, a camera on a user's mobile device may be used to capture the images of a product part of interest. This may involve, for example, the user rotating the camera about the product so as to capture several different images of the product part from several different angles. The captured images may then be uploaded from the mobile device to a server where they are further processed to generate a three-dimensional model of the product part. The three-dimensional model may then be compared to three-dimensional models of identified product parts. From this comparison, the identity of the user's part may be determined and a notification of the part's identity may be provided to the user's mobile device.

In some embodiments, a camera on a user's mobile device may be used to capture images of the product assemblage at a point during the assembly process. A three-dimensional model of the user's configuration of parts of the partially-assembled product may be generated from the captured images. A model of the correct configuration of the partially (or fully) assembled product may then be compared to the model of the user's configuration. Based on this comparison, the user may be notified if the partial assembly is incorrect.

Referring now to FIG. 1A, shown is a flowchart of an example method 100 for aiding a user in identifying a product part, in accordance with embodiments of the present disclosure. For example, the method may be used in helping a user identify a particular part of a product that the user is attempting to assemble. In some embodiments, the operations of method 100 may be performed by components of one or more computers. For example, the operations may be performed by a processor 502 of computer system 501 shown in FIG. 5.

The method 100 may begin at operation 101, wherein a user selection of a product identifier (e.g., product name, product serial number) of a product of interest is obtained by the processor. In some embodiments, the user may make the selection via a mobile device remote from the processor. For example, the user may enter the product name into a designated text field on a display of the mobile device. In some embodiments, the processor may be located on the mobile device.

Per operation 102, the processor may use the product identifier to obtain a set of images of identified parts of the product from a database. In some embodiments, the set of images may be within an electronic assembly manual for the product that is published by the manufacturer of the product. In some embodiments, the database may be a warehouse that includes images of identified parts for many different products. In such embodiments, the product identifier may be used to sort through the products/product parts to select the target image set. For example, if the user enters "Cutter Lawn Mower 7×L", then the processor may use that product identifier to find the set of images for parts contained in that particular lawn mower.

In some embodiments, the set of images of identified parts may include a single image per part, along with an identifier for that part. In other embodiments, multiple images (taken from different angles, in the form of video, etc.) may be included for each identified part. Further in some embodiments, images of the parts may be annotated with values (e.g., dimensions of subparts, colors) that may provide useful context to the images.

Per operation 103, the processor may obtain a set of images of a part of the selected product. The images of the part may be obtained for the purpose of identifying that part, for example, when the user does not know the identity of the part. The set of images may be captured by a camera of the user's mobile device and transmitted to the processor therefrom. As used herein a camera may refer to any image capturing technology, including, for example, video camera, three-dimensional camera, or a laser scanner. Thus, the set of images may include, for example, a single photograph of an unidentified part, multiple photographs of the unidentified part taken from different angles, or video footage of the unidentified part. Including multiple images of the unidentified part may be helpful in identifying the part because multiple images may provide benefits such as more precise scale definition.

In some embodiments, without having some frame of reference from which to evaluate an image of the unidentified part, it may be difficult to determine the physical size of the part or other characteristics about the part. For example, if the unidentified part is a bolt, it may be impossible to tell the thread pitch (distance between threads) of the bolt if the overall length of the bolt is not knowable from the images. In such embodiments, it may be useful to capture reference objects with baseline dimension measurements in the images of the unidentified part. Such a reference object could be a measuring device, for example, a ruler or a measuring tape. Furthermore such a reference object could be any other object with known dimensions. For example, if a user's shoe is included next to the unidentified part in one or more images, then the length of the user's shoe (if known to the processor) could be a baseline dimension from which dimensions of the reference object may be determined.

In some embodiments, another way that the processor could obtain a baseline measurement is by having the user measure a dimension of the unidentified part and then provide that dimension value to the processor along with the set of images of the part. With this baseline in hand, the processor may be able to calculate the other dimensions of the unidentified part using techniques known to those skilled in the art.

Per operation 104, the processor may compare the set of captured images (obtained from the user) to the images of identified parts of the selected product (obtained from the database). The image comparisons may, in some embodiments, rely on image analysis techniques such as object recognition, edge detection, and color analysis.

Further, in some embodiments, annotations of the images of identified parts may aid in these comparisons. Pre-labeled annotations of color, dimensions, or other characteristics of identified parts may be helpful. For example, if a particular dimension of the unidentified part is known (e.g., where the dimension is measured by the user and entered via a user interface or where the dimension is determined by the processor using a comparison to an in-frame reference object having a known dimension), then that particular dimension may be compared to annotated dimensions of the identified parts. Those identified parts having dissimilar values for that dimension may then be removed from consideration with limited analysis.

Per operation 105, the processor may determine, based on the comparisons, the identity of the unidentified part. In some embodiments, the determination may be made based on the part having the closest image match to the unidentified part. Per operation 106, the processor may notify the user (e.g., via the user's mobile device) of the identity of the part. Other information may be included in the notification as well. For example, the user may be provided with a video (live-action video, animated video, etc.) showing how to install the product part within the product assembly.

Per operation 107, a determination may be made as to whether there are any additional unidentified parts to be analyzed. In some embodiments, new sets of images showing the unidentified parts may be obtained. In other embodiments, the same set of images used to identify the first unidentified part may be used to identify an additional unidentified part. This may occur, for example, when a captured set of images depict the first unidentified part coupled to the additional unidentified part, which may allow the set of images to be used for identifying both parts. For each additional unidentified part, operations 103-106 may be repeated. Once there are no further parts to be identified, the method 100 may end.

While an example embodiment of the method 100 is described herein, many additional variants of the method 100 are contemplated. For example, in some embodiments, a particular part may be identified without first obtaining a user product selection of a product identifier. In such embodiments, operation 101 may be skipped and an image of an unidentified part captured by a user may be compared to images of identified parts in a database without the benefit of first narrowing down the images of identified parts to only parts that are known to be included in the product of interest.

In another variant of the method 100, in some embodiments, a part to be identified may not be an unidentified part per se. For example, the user may know the identity of the part generally, but may not know the supplier of the part or other identifying information about the part. In such situations, notifying the user of the identity of the part (e.g., per operation 106) may serve to provide the user with a tradename for the part or other identifying information that may increase the user's knowledge about the part.

In yet another variant of the method 100, in some embodiments, the processor may notify the user in situations where the image comparisons (e.g., of operation 104) were unsuccessful. The processor may also inform the user that one or more aspects of the unidentified part are not well captured in the set of images (e.g., where a particular aspect of the part is only captured in a blurry shot). The processor may specifically provide the user with an indicator of which aspects of the part need to be recaptured in a new set of images if the image comparisons are to be successful on a second attempt.

Figure 1B:
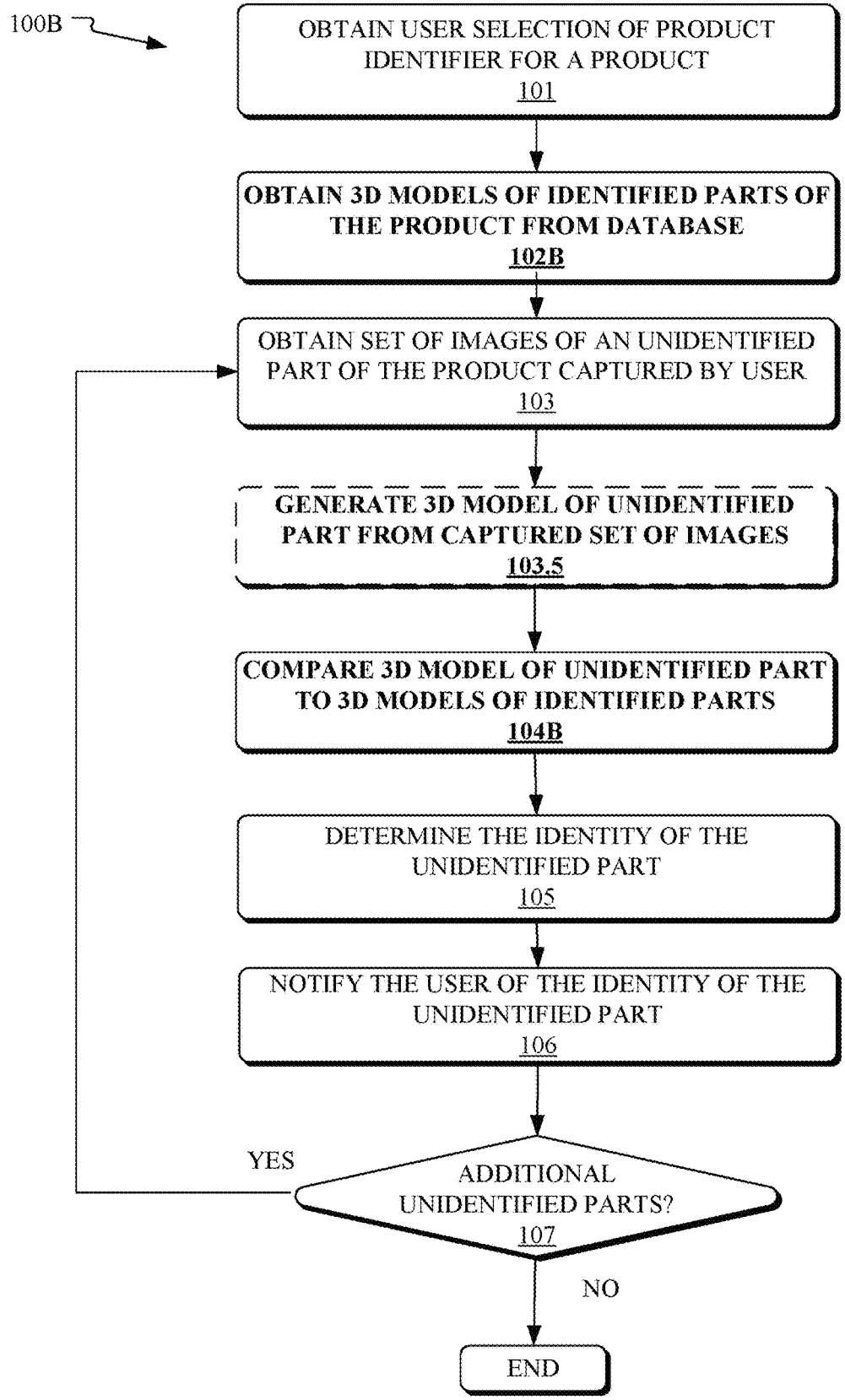
FIG. 1B illustrates a flowchart of an example method for using three-dimensional models to aid a user in identifying a product part, in accordance with embodiments of the present disclosure.

Referring now to FIG. 1B, shown is a flowchart of an example method 100B for using three-dimensional models to aid a user in identifying a product part, in accordance with embodiments of the present disclosure. The method 100B is a variant of the method 100 shown in FIG. 1A. In some embodiments, some of the operations of the method 100B may be the same as, or substantially similar to, the operations of the method 100. Some of the differences between the method 100 and the method 100B are described herein.

In some embodiments, the method 100B includes an operation 102B instead of, or in addition to, the operation 102 of method 100. Operation 102B may include obtaining from the database three-dimensional models of identified parts of the product, rather than two-dimensional images of these identified parts.

Furthermore, in some embodiments, the method 100B includes an operation 103.5 that is not utilized in some embodiments of method 100. Operation 103.5 may include generating a three-dimensional model of the unidentified product part using the set of images of the unidentified part captured in operation 103. Techniques for using captured images to generate models of real world objects are known to those skilled in the art. In some embodiments, the generation of the three-dimensional part model may utilize photogrammetric techniques that involve combining separate captured images of the part over multiple iterations of model-generation and recalibration cycles, with the goal of the iterative process being to generate a final model of the product part that is an accurate representation of the product part. In some situations, generating a model of the correct size may require the entry of a baseline measurement for the product part by the user.

Furthermore, in some embodiments, the method 100B includes an operation 104B instead of, or in addition to, the operation 104 of the method 100. Operation 104B may include comparing the three-dimensional model of the unidentified part (generated by the processor) with the three-dimensional models of the identified parts (obtained by the processor from the database). These comparisons may include, for example, overlaying models on top of each other or obtaining spatial dimensions of the models and determining if the corresponding dimensions in the models match each other.

Figure 2:
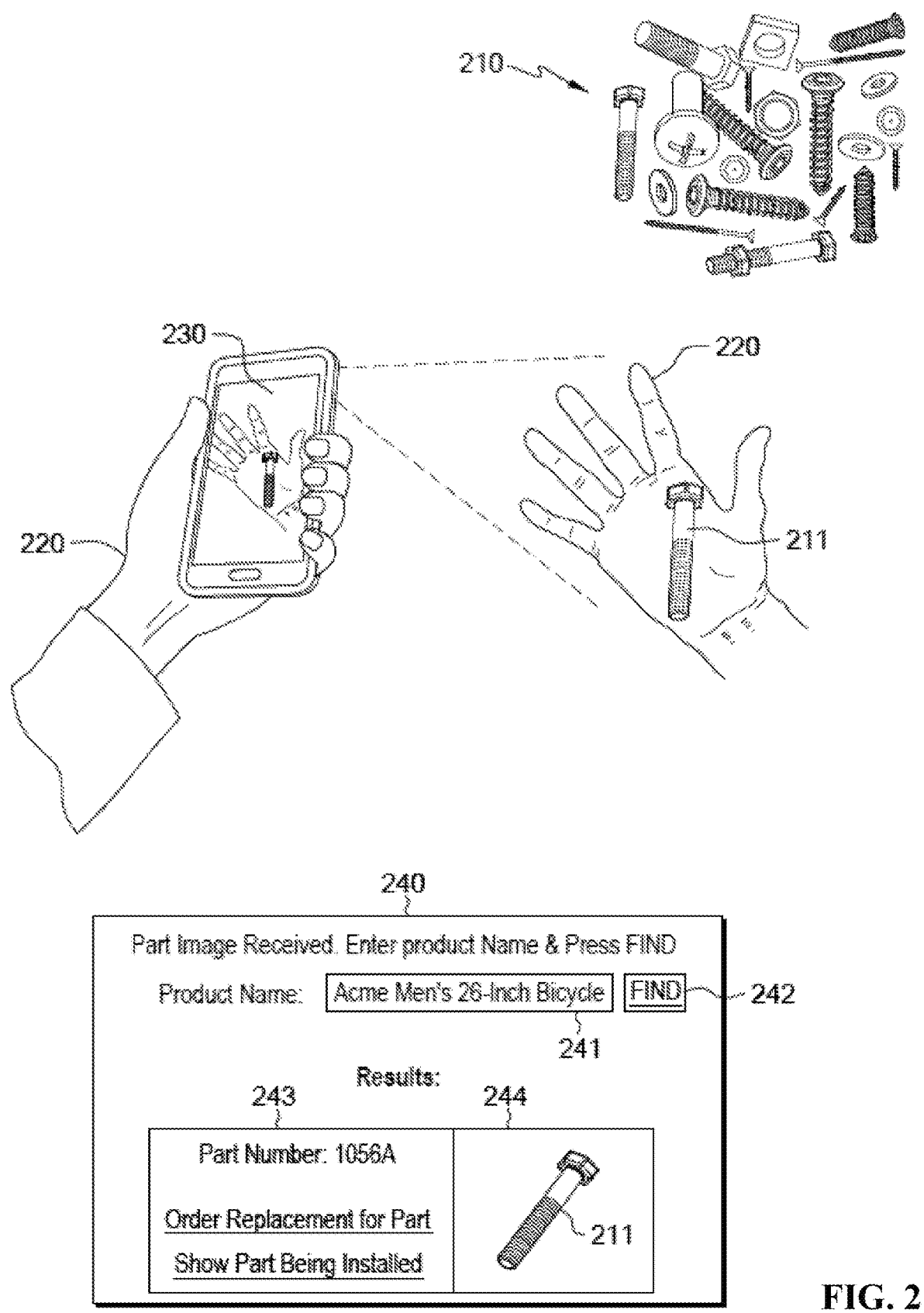
FIG. 2 illustrates a diagram of a mobile device being used for identification of a product part, in accordance with embodiments of the present disclosure.

Referring now to FIG. 2, shown is a diagram of a mobile device 230 being used for identification of a product part 211, in accordance with embodiments of the present disclosure. In this depicted example, a user 220 may be attempting to identify the product part 211 of a particular consumer product, in this instance a bicycle. The bicycle may have a plurality of parts 210 that together make up the bicycle. The user 220 may be attempting to identify the product part 211 for a variety of reasons. For example, the user 220 may be attempting to assemble the bicycle and may want to know the identity of the product part 211 in order to determine where on the bicycle it will be fitted. For another example, the user 220 may have discovered that the product part 211 is broken or otherwise in disrepair and may be trying to identify it so that a suitable replacement part for the bicycle can be obtained.

In order to identify the product part 211, the user 220 may first use a camera of the mobile device 230 to capture a set of images of the product part 211. More specifically, the user 220 may, in this example, use the camera to take a short video while rotating the product part 211 in hand in order to capture several different views of product part 211. Next, the user 220 may upload the captured images to a server (not depicted) via a graphical user interface (GUI) 240 which may be displayed on the mobile device 230. In some embodiments, the GUI 240 may be provided as part of mobile application specifically designed for use in consumer product part identification. Upon completion of the uploading of the captured images, the GUI 240 may provide a notification to the user 220 that the images have been received (e.g., via a message of "Part Image Received.") and may also provide the user 220 with a prompt to enter a product identifier for the product of interest (e.g., via a message of "Enter Product Name & Press FIND."). In some embodiments, the user 220 may also provide the server with a baseline measurement for the product part 211. This value may be provided as a value entered in the GUI 240 via a dimension indicator box (not shown). In some embodiments, the server may be able to determine the dimensions of the product part 211 by reference to other objects included in the captured images that have dimensions known to serve (e.g., where the user 220 previously uploaded the length of the user's index finger and then included the index finger in several of the captured images).

In response to the prompt described above, the user 220 may enter the product name, in this instance "Acme Men's 26-Inch Bicycle", into a textbox 241 and press the FIND button 242. This may cause the product name to be provided to the server. The server may then sort through various products included within its database in order to find a set of images of identified parts included in this particular bicycle model. Based on this sorting, the server may obtain images of all of the of the product parts 210 (including the product part of interest 211) known to be included in this bicycle model. In some embodiments, the server may obtain three-dimensional models (rather than two-dimensional images) of the product parts 210.

Once the relevant images are obtained, the captured image of the unidentified product part 211 may be compared by the server to the set of images obtained from the database. This comparison may rely on known image analysis techniques. In some embodiments, prior to these comparisons, the server may generate a three-dimensional model of the unidentified product part 211 from the captured images. Furthermore, in such embodiments, these comparisons may be comparisons of three-dimensional part models, rather than two-dimensional part images. Either way, the server may determine, based on the comparisons, the identity of the product part 211.

The identity of the product part 211 may be returned from the server to the user 220. Specifically, the user 220 may be notified of the identity of the product part 211 via the GUI 240. For example, as depicted, the notification may take the form of a "Results" portion of the GUI 240, which may include an image display section 244 showing an image (or three-dimensional model) of the product part 211. The Results portion may further include an informational display section 243 that provides information about the product part 211 to the user 220. In the depicted example, the informational display section 243 may include an identifier for the product part 211 (e.g., "Part Number: 1056A"), as well as a hyperlink to a website where a replacement for the product part 211 can be ordered and a second hyperlink to a website that includes a video showing how to install the product part 211 within the bicycle.

Figure 3A:
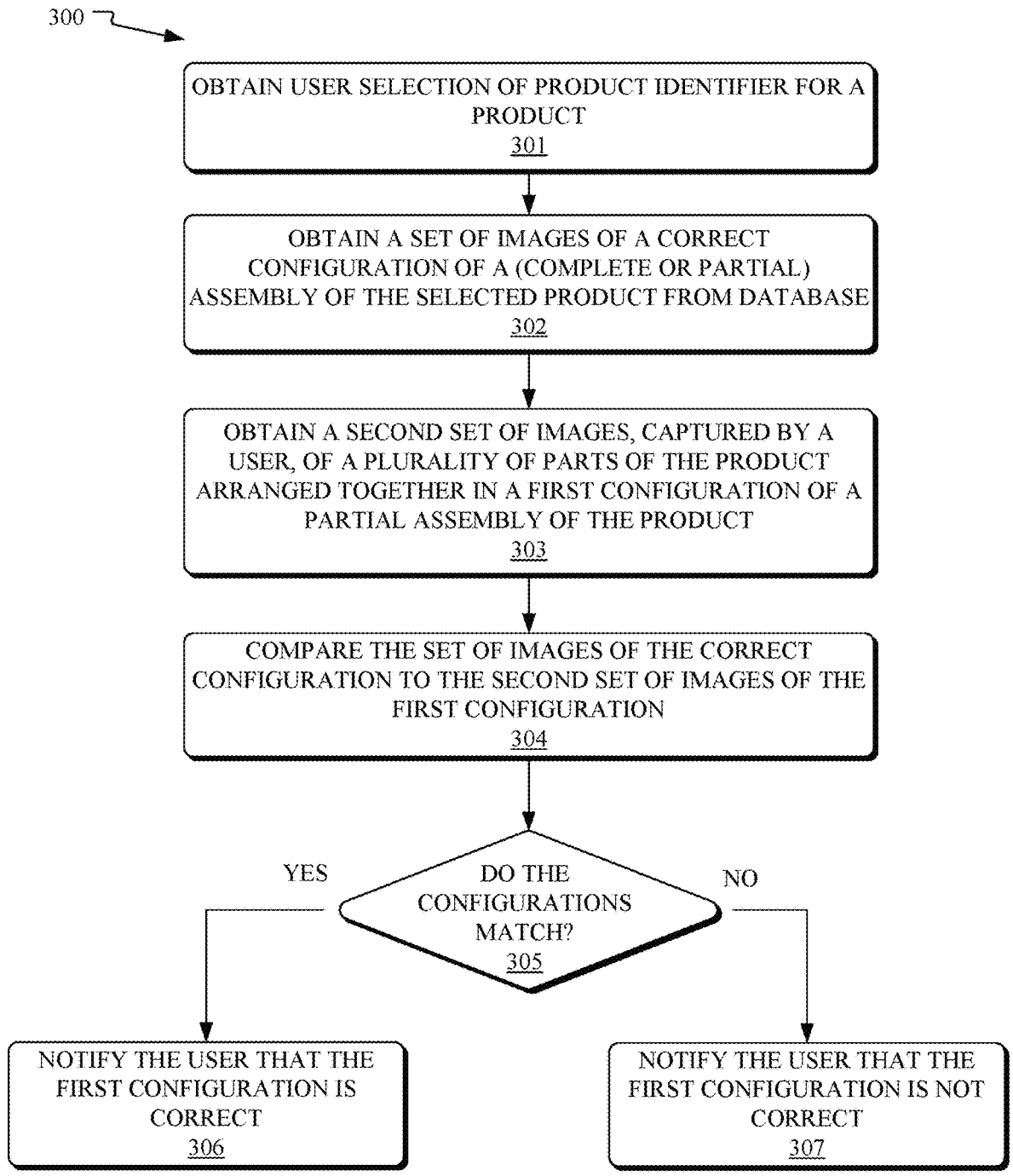
FIG. 3A illustrates a flowchart of an example method for aiding a user in assembling a product, in accordance with embodiments of the present disclosure.

Referring now to FIG. 3A, shown is a flowchart of an example method 300 for aiding a user in assembling a product, in accordance with embodiments of the present disclosure. For example, the method may be used in helping a user to determine if a product that the user is attempting to assemble is being put together correctly. In some embodiments, the operations of method 200 may be performed by components of one or more computers. For example, the operations may be performed by a processor 502 of computer system 501 shown in FIG. 5.

The method 300 may begin at operation 301, wherein a user selection of a product identifier (e.g., product name, product serial number) of a product of interest is obtained by the processor. In some embodiments, the user may make the selection via a mobile device remote from the processor. For example, the user may speak the product name into a microphone of a wearable device.

Per operation 302, the processor may use the product identifier to obtain, from a database, a set of images of a correct configuration of an assembly of the selected product. The correct configuration may be of a partial assembly of the product (e.g., with less than all of the product parts having been put together, with less than half of the product parts having been put together) or a complete assembly of the product (e.g., with all or substantially all of the product parts having been put together). In some embodiments, the set of images of the correct configuration may be within an electronic assembly manual for the product. Further, in some embodiments, the set of images may be included in an instructional video on how to assemble the selected product. In some embodiments, the database may be a warehouse that includes images of correct configurations of assemblies for many different products. In such embodiments, the product identifier may be used to sort through the products to select the target image set.

Per operation 303, the processor may obtain a second set of images, captured by a user, of a plurality of parts of the product arranged together in a first configuration of a partial assembly of the product. The second set of images of the partial assembly may be obtained for the purpose of determining whether the portion of the assembly that the user has completed has been done properly. The second set of images may be captured by a camera of the user's mobile device and transmitted to the processor therefrom. The second set of images may include, for example, a single photograph of a first configuration of the partial assembly, multiple photographs of the first configuration from different angles, or video footage of the first configuration. In some embodiments, the processor may obtain a baseline measurement for the first configuration to act as a frame of reference for size determinations.

Per operation 304, the processor may compare the correct configuration of the assembly (included in images obtained from the database) to the images of the first configuration of the partial assembly (obtained from the user). The image comparisons may, in some embodiments, rely on image analysis techniques such as object recognition, edge detection, and color analysis.

Further, in some embodiments, annotations of the images of the correct configuration may aid in these comparisons. Pre-labeled annotations of color, dimensions, relative part locations, or other characteristics of the parts as arranged in the correct configuration may be helpful. For example, if a first part is marked as being connected to a second part in a correct configuration, but the parts are not located near each other in the user's partial configuration, then the processor may be able to determine quickly that the configurations are non-matching. Further, in some embodiments, images may be overlaid on top of each other for the purpose of comparison.

Per operation 305, the processor may determine, based on the comparisons, whether the configurations match. In some embodiments where a user's configuration of a partial assembly is being compared to a correct configuration of a complete assembly (rather than a comparison of two partial assemblies), the configurations may be deemed to match in situations where the relevant portion of the correct configuration matches the user's configuration of the partial assembly. If the configurations do match, then, per operation 306, the processor may notify the user (e.g., via the user's mobile device) that the first configuration is correct. If, however, the configurations do not match, then, per operation 307, the processor may notify the user that the first configuration is not correct.

While an example embodiment of the method 300 is described herein, many additional variants of the method 300 are contemplated. For example, in some embodiments, determination may be made as to whether a user's configuration is correct without first obtaining a user product selection of a product identifier. In such embodiments, operation 301 may be skipped and an image of a first configuration of a partial assembly of a product may be compared to an image of a correct configuration of the assembly obtained from a database without the benefit of first narrowing down the images of assemblies to only complete or partial assemblies of the product of interest based on a user selection. This may, in some embodiments, mean that an extra step is required to identify (e.g., directly from the image obtained from the user) the product of interest.

In another variant of the method 300, in some embodiments, the image obtained from the user may be of a completed assembly rather than just a partial assembly. In such embodiments, the focus of the image comparison may be only on a portion of the configuration of the user's assembly rather than on the whole completed assembly.

In yet another variant of the method 300, in some embodiments, product parts within an image of the user's partial assembly may be identified by the processor prior to (or as part of) the comparing the user's configuration to the correct configuration. For example, in a situation where a user's partial assembly includes a plurality of product parts, it may be advantageous to determine the identity of one or more of those parts before analyzing the partial assembly as a whole. The identification of individual parts of the partial assembly may be completed, for example, by using operations of method 100 of FIG. 1A and/or operations of method 100B of FIG. 1B. Once the individual parts are identified, it may be easier for the processor to obtain a relevant set of images of a correct configuration of the assembly of the product from the database. For example, if the processor determines that the user's partial assembly includes parts A and B, but not part C, then the processor may decide to compare the user's configuration of a partial assembly to a set of images that include a correct configuration of a partial assembly that includes only parts A and B. By comparing configurations that are at the same or similar stage in the assembly process, comparisons may be more reliable.

In yet another variant of the method 300, in some embodiments, the processor may not be able to determine whether the user's configuration matches the correct configuration (e.g., in operation 305), for example, because images of the user's configuration were poorly captured or not enough images were captured of a specific aspect of the user's configuration. In such situations, the processor may provide the user (e.g., via a GUI of the user's mobile device) an indication of which aspects of the user's configuration need to be recaptured (e.g., by showing the user a blurry image of these aspects, as captured by the user). The user may respond by capturing and uploading new images of these aspects, as instructed. Using these new images, the processor may be able to complete the determination as to whether the user's configuration is correct.

Figure 3B:
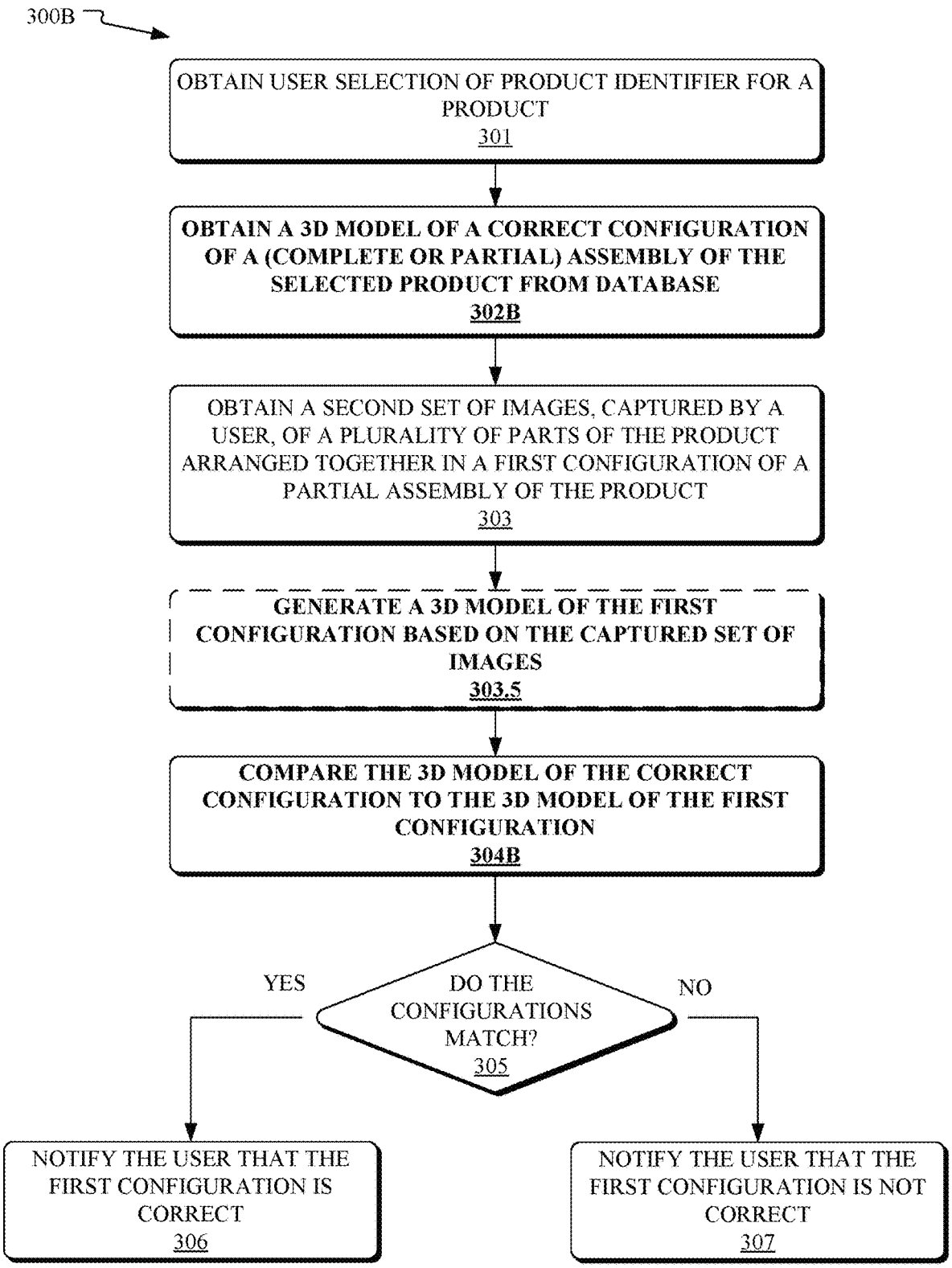
FIG. 3B illustrates a flowchart of an example method for using three-dimensional models to aid a user in assembling a product, in accordance with embodiments of the present disclosure.

Referring now to FIG. 3B, shown is a flowchart of an example method 300B for using three-dimensional models to aid a user in assembling a product, in accordance with embodiments of the present disclosure. The method 300B is a variant of the method 300 shown in FIG. 3A. In some embodiments, some of the operations of the method 300B may be the same as, or substantially similar to, the operations of the method 300. Some of the differences between the method 300 and the method 300B are described herein.

In some embodiments, the method 300B includes an operation 302B instead of, or in addition to, the operation 302 of method 300. Operation 302B may include obtaining from the database a three-dimensional model of a correct configuration of a (complete or partial) assembly of the selected product, rather than two-dimensional images of the selected product.

Furthermore, in some embodiments, the method 300B includes an operation 303.5 that is not utilized in some embodiments of method 300. Operation 303.5 may include generating a three-dimensional model of the first configuration of the partially assembled product using the second set of images of the first configuration captured in operation 303. In some embodiments, one or more measurements of the first configuration obtained from the user may also be utilized in this model generation. Techniques for using captured images to generate models of real world objects are known to those skilled in the art.

Furthermore, in some embodiments, the method 300B includes an operation 304B instead of, or in addition to, the operation 304 of the method 300. Operation 304B may include comparing the three-dimensional model of the first configuration (generated by the processor) with the three-dimensional model of the correct configuration (obtained by the processor from the database). This comparison may include, for example, overlaying the models on top of each other or obtaining spatial dimensions of the models and determining if the corresponding dimensions in the models match each other.

Figure 4:
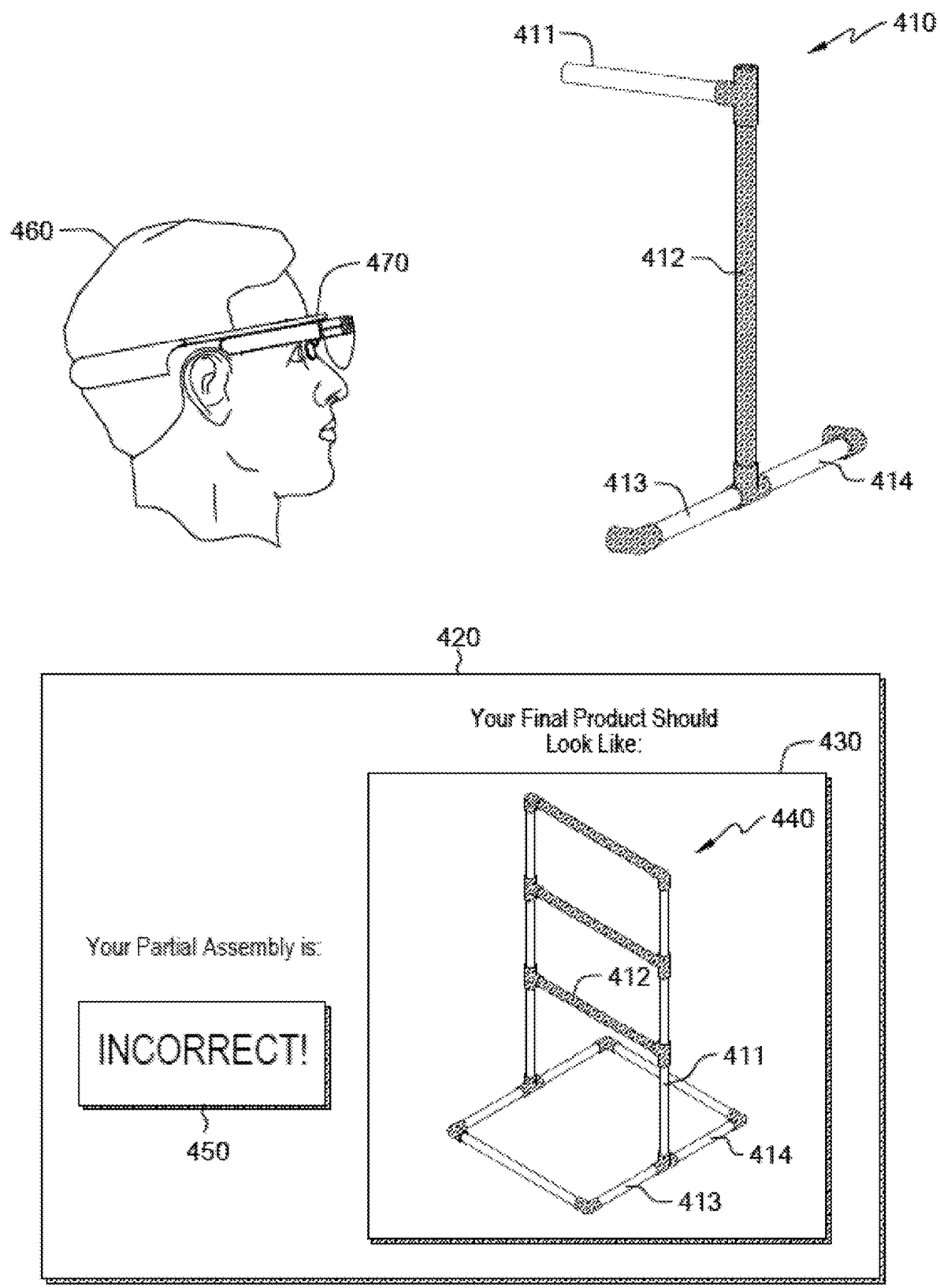
FIG. 4 illustrates a diagram of a mobile device being used in determining whether a user's configuration of partial assembly of a product is correct, in accordance with embodiments of the present disclosure.

Referring now to FIG. 4, shown is a diagram of a mobile device 470 being used determining whether a user's configuration of partial assembly 410 of a product is correct, in accordance with embodiments of the present disclosure. In this depicted example, a user 460 may be attempting to determine if he is putting the parts of a product together in the correct configuration. In this instance, the product is a stand for a ladderball toss game and the user 460 has connected some of the parts of the stand into a configuration of a partial assembly 410. As shown, the user's configuration of the partial assembly 410 of the stand includes two light tubes 413 and 414 connected together at the lower end of a dark tube 412. The top of the dark tube 412 is connected to a third light tube 411.

In order to analyze the partial assembly 410, the user 460 may first use a camera of his head-mounted wearable device 470 to capture a set of images of the partial assembly 410. More specifically, the user 460 may, in this example, use the camera to take several photos while moving around the partial assembly 410 in order to capture several different views of the partial assembly 410. In some embodiments, reference objects with known spatial dimensions may be included in the captured images. Next, the user 460 may communicate with the wearable device 470 about the captured images via a graphical user interface (GUI) 420 which may be displayed on the wearable device 470. In some embodiments, the GUI 420 may be provided as part of mobile application specifically designed for use in assembling lawn games.

Upon completion of the capturing of the captured images, the wearable device 470 may compare the captured images to a set of preloaded images of a correct configuration of a completed assembly 440 of the stand. In the alternative (or in addition), the wearable device may generate a three-dimensional model of the partial assembly 410 and compare this model to a set of preloaded three-dimensional models of the completed assembly 440.

The comparisons may rely on known image analysis techniques. Based on the results of the comparisons, the wearable device 470 may determine whether the user's configuration of the partial assembly 410 is correct. In the depicted example, the tubes 411 and 412 are, within the partial assembly 410, in incorrect locations relative to the parts 413 and 414. Thus, the wearable device may determine that the user's configuration is incorrectly assembled. Based on this determination, the wearable device 470 may notify the user 460 that the partial assembly 410 is incorrect via the GUI 420. Specifically, as depicted, the GUI 420 may show an image box 430 having an image or model of the correct configuration of the completed assembly 440. The GUI 420 may also include a text box 450 indicating to the user 460 that his assembly is incorrect. Armed with this knowledge, the user 460 may then reconfigure the partial assembly 410 and then properly complete the assembly of the stand.

In some embodiments, methods of the present disclosure may be useful for determining whether a replacement part that is not identical to the part it is replacing will be an acceptable alternative. This may involve comparing images (e.g., three-dimensional models) of the original part and the replacement part. The differences between the parts may be determined based on the comparison. These differences may be weighed based on relative importance. For example, portions of a part that are points of connection with other parts may need to be duplicated more precisely in the replacement, while other portions of the part that are ornamental designs may be of less importance to replicate closely. If the differences between the original part and the replacement part do not meet a set of replacement part criteria, then the replacement part may be deemed an unsuitable replacement and the user may be notified of such.

To aid understanding, examples of additional scenarios employing embodiments of the present disclosure are described herein. In a first scenario, an individual purchases a grill that needs to be assembled. The grill comes with right and left side panels. The panels are identical except the left side has an extra cutout for a side burner. As the user assembles the grill, she unknowingly reverses the locations of the side panels. As the assembly continues, the user begins to suspect that something is wrong because some of the parts do not appear to be aligning properly. The user then stops the assembly process and takes pictures of the grill with her mobile phone. The images of the grill are then uploaded to a server and compared to images of the correctly assembled grill at various stages of assembly. The server determines that the left side burner is inappropriately positioned and notifies the user via her mobile phone. The user then switches the side panels and completes the grill assembly.

In a second scenario, an individual purchases a curio that has several disassembled parts. While the individual puts the curio together, his wearable device periodically takes photos of the assembly and automatically compares them to images of correct versions of the assembly. The wearable device does not notify the user of any problems until, after an eighth iteration of the comparison process, the device determines that the most recently-added part of the curio was installed in the wrong spot. The device then warns the user that there has been an error and the user responds by correcting the mistake and continuing to assemble the curio.

In a third scenario, a person discovers that a part from her automobile is worn out. She removes the part from her vehicle and uses the camera on her tablet computer to take several photos of the part. Her tablet then generates a three-dimensional model of the part from the captured images. Next, the person goes to a local automobile parts store to look for a replacement part. At the store, she discovers that the original equipment manufacturer has discontinued the part. She sees a replacement part that is similar, but not identical, to the part she is replacing. To determine if the part will be a suitable replacement, she obtains a three-dimensional model of the replacement part on her tablet. Her tablet then compares the models of the part and the replacement part. The tablet identifies several differences between the parts but determines that the general shapes of the parts as well as the connection points on the parts are close enough in design that the replacement part will be suitable. The user is notified that the replacement part is acceptable. She then buys the replacement part and installs it in her vehicle.

Figure 5:
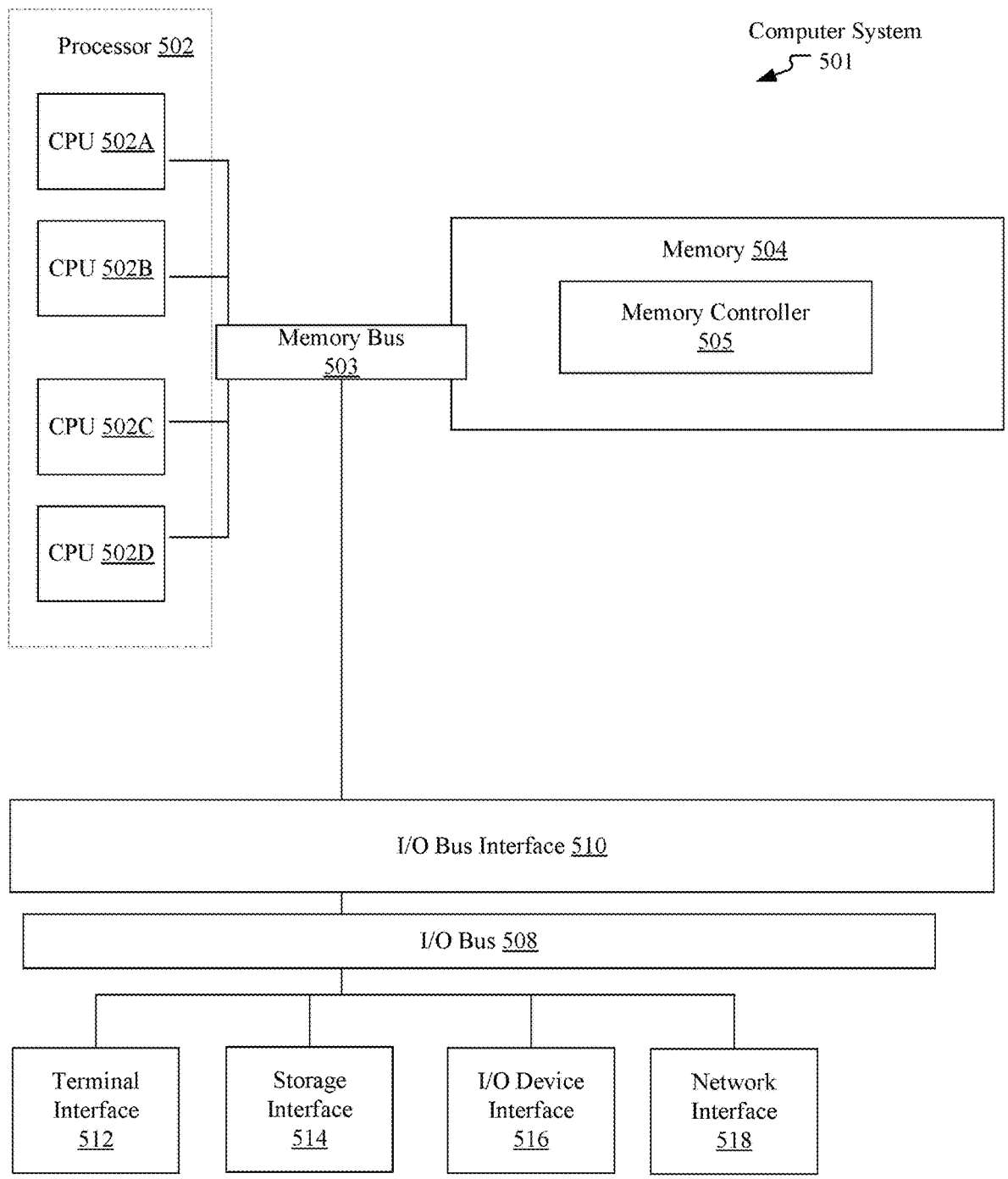
FIG. 5 illustrates a high-level block diagram of an example computer system that may be used in implementing one or more of the methods described herein, in accordance with embodiments of the present disclosure.

Referring now to FIG. 5, shown is a high-level block diagram of an example computer system (i.e., computer) 501 that may be used in implementing one or more of the methods, tools, and modules, and any related functions or operations, described herein (e.g., using one or more processor circuits or computer processors of the computer), in accordance with embodiments of the present disclosure. In some embodiments, the major components of the computer system 501 may comprise one or more CPUs 502, a memory subsystem 504, a terminal interface 512, a storage interface 514, an I/O (Input/Output) device interface 516, and a network interface 518, all of which may be communicatively coupled, directly or indirectly, for inter-component communication via a memory bus 503, an I/O bus 508, and an I/O bus interface unit 510.

The computer system 501 may contain one or more general-purpose programmable central processing units (CPUs) 502A, 502B, 502C, and 502D, herein generically referred to as the CPU 502. In some embodiments, the computer system 501 may contain multiple processors typical of a relatively large system; however, in other embodiments the computer system 501 may alternatively be a single CPU system. Each CPU 502 may execute instructions stored in the memory subsystem 504 and may comprise one or more levels of on-board cache.

In some embodiments, the memory subsystem 504 may comprise a random-access semiconductor memory, storage device, or storage medium (either volatile or non-volatile) for storing data and programs. In some embodiments, the memory subsystem 504 may represent the entire virtual memory of the computer system 501, and may also include the virtual memory of other computer systems coupled to the computer system 501 or connected via a network. The memory subsystem 504 may be conceptually a single monolithic entity, but, in some embodiments, the memory subsystem 504 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures. In some embodiments, the main memory or memory subsystem 504 may contain elements for control and flow of memory used by the CPU 502. This may include a memory controller 505.

Although the memory bus 503 is shown in FIG. 5 as a single bus structure providing a direct communication path among the CPUs 502, the memory subsystem 504, and the I/O bus interface 510, the memory bus 503 may, in some embodiments, comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 510 and the I/O bus 508 are shown as single respective units, the computer system 501 may, in some embodiments, contain multiple I/O bus interface units 510, multiple I/O buses 508, or both. Further, while multiple I/O interface units are shown, which separate the I/O bus 508 from various communications paths running to the various I/O devices, in other embodiments some or all of the I/O devices may be connected directly to one or more system I/O buses.

In some embodiments, the computer system 501 may be a multi-user mainframe computer system, a single-user system, or a server computer or similar device that has little or no direct user interface, but receives requests from other computer systems (clients). Further, in some embodiments, the computer system 501 may be implemented as a desktop computer, portable computer, laptop or notebook computer, tablet computer, pocket computer, telephone, smart phone, mobile device, or any other appropriate type of electronic device.

It is noted that FIG. 5 is intended to depict the representative major components of an exemplary computer system 501. In some embodiments, however, individual components may have greater or lesser complexity than as represented in FIG. 5, components other than or in addition to those shown in FIG. 5 may be present, and the number, type, and configuration of such components may vary.

As used herein and unless clearly indicated to the contrary, the phrase "based on" and phrases substantially similar thereto are intended be construed broadly to include "based partially on", "based fully on", "based directly on", and "based indirectly on".

As discussed in more detail below, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. At least one non-transitory computer-readable storage medium storing processor-executable instructions that, when executed by at least one processor, cause the at least one processor to perform a method for aiding a user in identifying at least one part of a product, wherein the product is an assemblage of a plurality of parts, the method comprising:

obtaining a plurality of images of a target part of the product captured by the user using a camera;

generating, based on the plurality of images of the target part, a three-dimensional model of the target part;

comparing the target part to a plurality of identified parts by overlaying a three-dimensional model of each identified part onto the three-dimensional model of the target part to identify the target part, wherein prior to the comparing an identity of the target part is unknown; and determining, based on results of the comparing, the identity of the target part.

2. The at least one non-transitory computer-readable storage medium of claim 1, wherein the method further comprises:

notifying the user of the identity of the target part.

3. The at least one non-transitory computer-readable storage medium of claim 1, wherein the method further comprises:

obtaining an identifier of the product, wherein the product identifier is selected by the user; and selecting, prior to the comparing, the three-dimensional models of the identified parts from a database based on the obtained product identifier.

4. The at least one non-transitory computer-readable storage medium of claim 3, wherein the database includes three-dimensional models of parts sorted by product identifiers of products in which the parts are included.

5. The at least one non-transitory computer-readable storage medium of claim 1, wherein the method further comprises:

providing the user with the identity of the target part and a video showing how to install the target part within the assemblage.

6. A method for aiding a user in obtaining a replacement for a broken part of a product assembly, the method comprising:

obtaining, by at least one processor, a plurality of images of the broken part captured using a camera;

generating, by the at least one processor and based on the plurality of images of the broken part, a three-dimensional model of the broken part;

comparing the three-dimensional model of the broken part to a three-dimensional model of a potential replacement part;

determining, by the at least one processor and based on results of the comparing, that portions of the broken part that are configured to be connected with other parts of the product assembly are the same as corresponding portions of the potential replacement part and that at least one feature of the broken part is different from a corresponding at least one feature of the potential replacement part;

determining, by the at least one processor, that the potential replacement part is a replacement for the broken part based on the determination that the corresponding portions of the broken part and the potential replacement part are the same even though the broken part and the potential replacement part are determined to have different features; and notifying, by the at least one processor, the user that the potential replacement part is a replacement for the broken part.

7. The at least one non-transitory computer-readable storage medium of claim 1, wherein the method further comprises:

determining, based on the plurality of images of the target part, lengths of dimensions of the target part;

obtaining an identifier of the product, wherein the product identifier is selected by the user using a mobile device;

selecting, based on the obtained product identifier and from a product database containing information about different parts included in a plurality of different products, the plurality of parts of the product from among the different parts;

obtaining, from the product database, lengths of dimensions of the plurality of parts;

comparing the lengths of dimensions of the target part to the lengths of the corresponding dimensions of each of the plurality of parts;

selecting, based on the compared lengths, the plurality of identified parts from among the plurality of parts;

obtaining, from the product database, the three-dimensional model of each identified part of the plurality of identified parts; and notifying the user of the identity of the target part.

8. The at least one non-transitory computer-readable storage medium of claim 1, wherein the target part is a replacement part for a part of the product, and the method further comprises:

providing the user with information to purchase the replacement part.

9. The method of claim 6, further comprising:

obtaining, by the at least one processor, a plurality of images of the potential replacement part captured using the camera;

generating, by the at least one processor and based on the plurality of images of the potential replacement part, the three-dimensional model of the potential replacement part.

10. The method of claim 6, wherein comparing the three-dimensional model of the broken part to the three-dimensional model of a potential replacement part comprises:

overlaying the three-dimensional model of the broken part onto the three-dimensional model of the potential replacement part.

11. The method of claim 6, wherein the broken part and the potential replacement part are determined to have different ornamental features.

12. A system comprising:

at least one processor; and at least one non-transitory computer-readable storage medium storing processor-executable instructions that, when executed by at least one processor, cause the at least one processor to perform a method for aiding a user in obtaining a replacement for a broken part of a product assembly, the method comprising:

obtaining, by the at least one processor, a plurality of images of the broken part captured using a camera;

generating, by the at least one processor and based on the plurality of images of the broken part, a three-dimensional model of the broken part;

comparing the three-dimensional model of the broken part to a three-dimensional model of a potential replacement part;

determining, by the at least one processor and based on results of the comparing, that portions of the broken part that are configured to be connected with other parts of the product assembly are the same as corresponding portions of the potential replacement part and that at least one feature of the broken part is different from a corresponding at least one feature of the potential replacement part;

determining, by the at least one processor, that the potential replacement part is a replacement for the broken part based on the determination that the corresponding portions of the broken part and the potential replacement part are the same even though the broken part and the potential replacement part are determined to have different features; and notifying, by the at least one processor, the user that the potential replacement part is a replacement for the broken part.

13. The system of claim 12, where the method further comprises:

obtaining, by the at least one processor, a plurality of images of the potential replacement part captured using the camera;

generating, by the at least one processor and based on the plurality of images of the potential replacement part, the three-dimensional model of the potential replacement part.

14. The system of claim 12, wherein comparing the three-dimensional model of the broken part to the three-dimensional model of a potential replacement part comprises:

overlaying the three-dimensional model of the broken part onto the three-dimensional model of the potential replacement part.

15. The system of claim 12, wherein the broken part and the potential replacement part are determined to have different ornamental features.

* * * * *